United States Patent
Politiek et al.

(10) Patent No.: US 6,326,631 B1
(45) Date of Patent: Dec. 4, 2001

(54) ION IMPLANTATION DEVICE ARRANGED TO SELECT NEUTRAL IONS FROM THE ION BEAM

(75) Inventors: Jarig Politiek, Baarn; Gerrit C. Van Hoften, Eindhoven, both of (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/400,762

(22) Filed: Sep. 21, 1999

(30) Foreign Application Priority Data

Sep. 24, 1998 (EP) .................................. 98203227

(51) Int. Cl.[7] .................................................. H01J 37/317
(52) U.S. Cl. ................................. 250/492.21; 250/413 R; 250/396 R; 315/111.81; 315/111.61
(58) Field of Search ........................... 250/492.21, 423 R, 250/396 R; 315/111.81, 111.61

(56) References Cited

U.S. PATENT DOCUMENTS 5,387,843 * 2/1995 Nagayama et al. ............. 315/111.81

FOREIGN PATENT DOCUMENTS 4284343A 10/1992 (JP) .

* cited by examiner

Primary Examiner—Bruce Anderson
Assistant Examiner—Nikita Wells
(74) Attorney, Agent, or Firm—Norman N. Spain

(57) ABSTRACT

An ion implantation device includes at least two successive deceleration stages the first deceleration stage, looking in the downstream direction, being arranged to decelerate the ion beam, to deflect the ion beam, and to form an intermediate crossover, whereas the second deceleration stage is arranged to decelerate the ion beam further and to subject the beam to a converging effect.

7 Claims, 2 Drawing Sheets

ION IMPLANTATION DEVICE ARRANGED TO SELECT NEUTRAL IONS FROM THE ION BEAM

BACKGROUND OF THE INVENTION

The invention relates to an ion implantation device which includes: an ion source for producing a beam of ions to be implanted into a substrate, an acceleration electrode for accelerating the ion beam emanating from the ion source, ion-optical elements which are arranged downstream from the acceleration electrode in order to influence the direction of the ions in the ion beam, and a deceleration device which is arranged downstream from said ion-optical elements in order to decelerate the ion beam.

The invention also relates to a method of implanting ions in a substrate.

A device of the kind set forth is known from the abstract in English of Japanese patent application No. 3-47123, filed on Mar. 13, 1991 and published under publication No. 4-284343 on Oct. 8, 1992.

Ion implantation is commonly used in the manufacture of integrated circuits in order to form specified doping profiles, for example a specified doped ion concentration as a function of the depth in the substrate. The ion beam required for this purpose is produced in known manner by an ion source, after which the beam is accelerated to a desired velocity by an (electrostatic) acceleration electrode which directly succeeds the ion source. For the further influencing of the ion beam such a device may also be provided with ion-optical elements, such as a deflection device for scanning the beam across the substrate to be doped and charged particle lenses for focusing or otherwise converging or diverging the ion beam.

Subsequent to the acceleration electrode said known device is provided with an ion-optical element in the form of a mass separation unit for separating ions having an undesirable mass from the ion beam, so that the ion beam thus produced consists of one type of ion only. From the particle-optical technique it is generally known that in order to achieve suitable and controlled influencing of the ion beam by the ion-optical elements is desirable that the ion beam has a sufficiently high velocity, for example a velocity which corresponds to a kinetic energy of the order of magnitude of from tens to hundreds of keV. A typical value in this respect is 30 keV, thus corresponding to a voltage of 30 kV on the acceleration electrode (the acceleration voltage). This is because when the energy of the bam is too low (for example, 1 keV), the beam becomes highly susceptible to disturbing influences from inside and outside the apparatus and to undesirable expansion of the beam due to space charging in the beam.

Said specified doping profiles often require the ions to be implanted only in a zone up to a specified depth in the substrate to be doped. To this end, the ions may be incident on the substrate only with a given, specified velocity, i.e. energy. This specified energy may typically be of the order of magnitude of 1 keV. In order to conduct the ion beam through the ion-optical elements with a sufficiently high energy and nevertheless make the beam land on the substrate with the specified energy, downstream from said ion-optical elements there is arranged in known manner a deceleration device for decelerating the ion beam to the desired energy.

The described processes take place in an evacuated space. The vacuum of this space is often of poor quality because gases are released during irradiation of the substrate by means of ions (notably from the residual material on the substrate), which ions are spread through the vacuum space. During traveling of the path from the ion source to the deceleration device, interaction with the released gases and the residual gases always present in the apparatus neutralizes a part of the ions in the beam. These neutralized ions (i.e. atoms) are no longer sensitive to influencing by the ion optical elements and the deceleration device, so that these atoms strike the substrate with the full energy of, for example 30 keV and hence penetrate therein to a depth which is much greater than the depth corresponding to the specified doping profile. Moreover, such atoms are not sensitive to fields applied for scanning the beam across the substrate to be treated, so that these atoms form a stationary dot "spot" at the center of the substrate region to be doped, thus locally causing an inadmissibly high concentration of the relevant element in the substrate. In order to counteract the problems concerning the neutralized ions, the deceleration device for decelerating the ion beam in the known ions implantation device is also arranged to deflect the ion beam. The neutralized ions (i.e. the atoms) which are not sensitive to electromagnetic deflection then continue their travel in the original direction and hence can be separated from the deflected ion beam.

In these known devices a problem is encountered in that the deceleration device consists of an assembly of three electrodes which together constitute an electrostatic lens. The first electrode of this lens carries a potential which amounts to a fraction of the acceleration voltage (thus, this first electrode is actually formed by the boundary of the drift space carrying said potential); the third electrode of this lens carries ground potential (the third electrode is actually formed by the entrance of the treatment space of the substrate which carries ground potential), whereas the central electrode carries a potential which lies between said two potentials. In particle optics it is generally known that electrostatic deceleration is inevitably accompanied by a lens effect exerted by the decelerating field. Due to this lens effect, the ion beam is subjected to a diverging or a converging action. For said order of magnitude of the acceleration voltage and the ultimate speed of landing of the ion beam, the ions in the beam are given an inadmissibly large velocity component transversely of the beam axis due to said diverging or converging effect. Consequently, a significant part of the ions would not reach the substrate, because they would be intercepted by beam limiters between the deceleration electrodes and the substrate. Moreover, a large angular spread of the ions in the beam could cause a shading effect on the substrate to be doped. This means that the ion beam which apparently emanates from one point fans out in a conical manner, so that regions on the substrate which directly adjoin an edge of a region with a given difference in height with respect to the remainder of the substrate are situated in the shade of said edge and hence receive fewer ions than the regions which are not situated in the shade. For these two reasons the angular spread of the ion beam incident on the substrate must be small.

SUMMARY OF THE INVENTION

It is an object of the invention to provide an ion implantation device of the kind set forth in which neutralized ions can be separated from the ion beam and in which the ion beam is decelerated without imparting an inadmissibly large angular spread to the ion beam.

To achieve this, the device according to the invention is characterized in that the deceleration device includes at least two successive deceleration stages the first one of the two deceleration stages, viewed in the downstream direction, being arranged to decelerate the ion beam, to deflect the ion beam, and to form an intermediate crossover, said second deceleration stage being arranged to decelerate the ion beam further and to subject the beam to a converging effect.

The first deceleration stage is constructed in such a manner that the beam is subjected to a first deceleration therein. This stage can be proportioned in such a manner that an intermediate crossover of the ion beam is formed by the lens effect associated with this deceleration, i.e. a crossover which is situated in the region between the exit of the first deceleration stage and the entrance of the second deceleration stage, that is to say in a position such that the lens effect of the decelerating field of the second stage converges the beam in such a manner that the beam exhibits the required small angular spread on the substrate. The neutralized ions are separated from the ion beam by the deflecting effect of the first stage.

In a preferred embodiment of the device according to the invention a selection gap is provided between the first and the second deceleration stage, the direction of said gap extending transversely of the plane in which the beam is deflected by the first deceleration stage. The neutral ions can thus be readily separated from the ion beam, and at the same time energy selection can also be performed in the ion beam by a suitable choice of the gap width. The selection gap is advantageously provided in the final electrode of the first deceleration stage, so that in that case it is not necessary to mount separate elements in the vacuum housing of the apparatus.

In a further embodiment of the device according to the invention, the second deceleration stage is succeeded by a further selection gap whose direction extends transversely of the plane in which the beam is deflected by the first deceleration stage. This is because it may occur that neutralization of ions in the ion beam still takes place in the region in the first deceleration stage in which complete or partial deflection of the beam has already taken place. The ions produced at that area are situated in the direct vicinity of the intermediate crossover, so that a very large part thereof has a significant transverse component in the speed, because the beam is strongly diverging in the vicinity of the intermediate crossover. These neutral particles can then pass the selection gap, but are not subjected to the converging effect of the second acceleration stage. Thus, beyond this second stage such an undesirable neutral particles will be separated from the ion beam by means of a further selection gap. Like in the first deceleration stage, the further selection gap is advantageously provided in the final electrode of the associated deceleration stage, so that it again will not be necessary to mount separate elements in the vacuum housing of the apparatus.

The invention will now be described in greater detail with reference to the figures of the drawing.

DETAILED DESCRIPTION OF THE INVENTION

Figure 1:
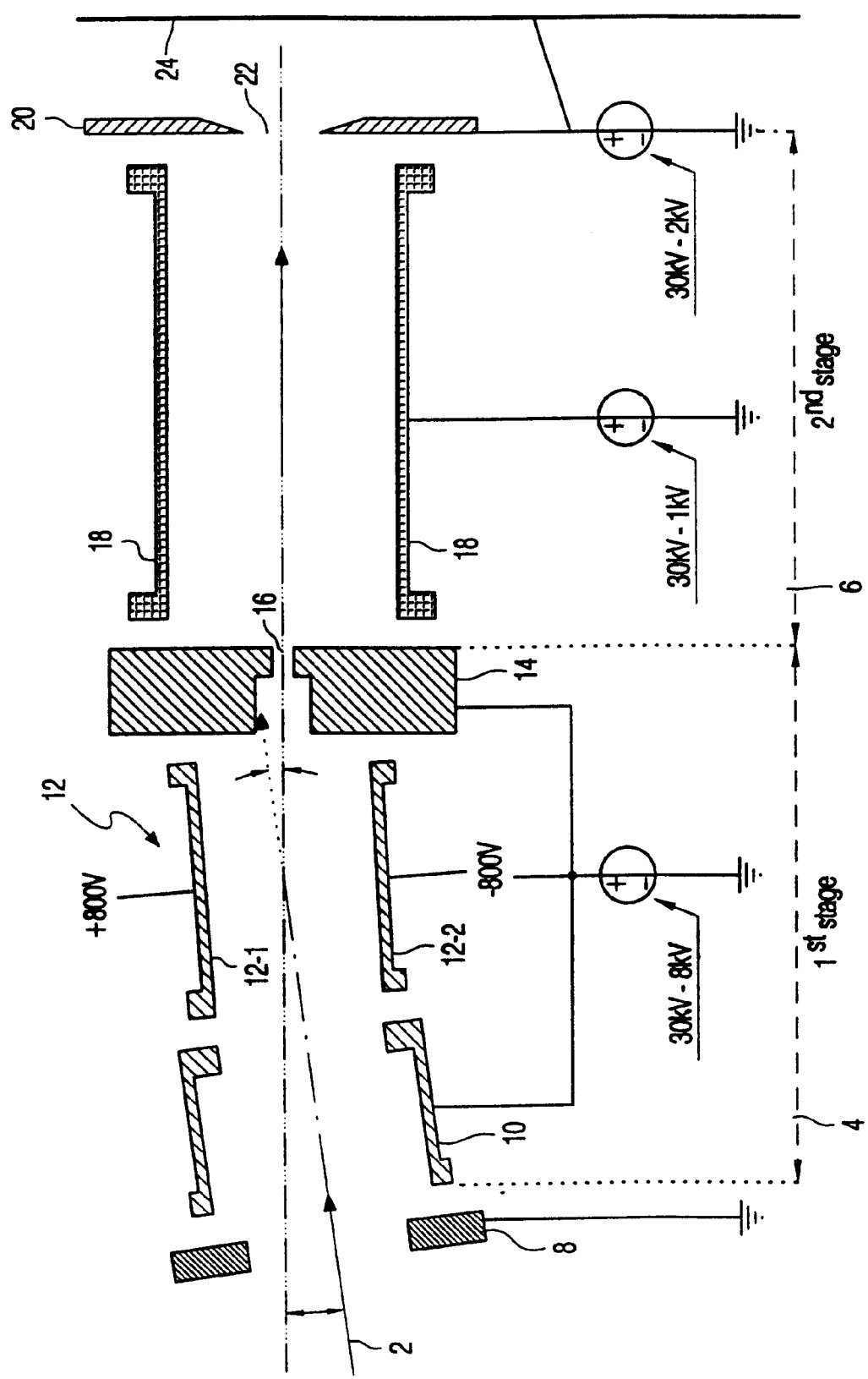
FIG. 1 shows diagrammatically a part of an ion implantation device which is of relevance to the invention.

FIG. 1 shows diagrammatically a part of an ion implantation device which is of relevance to the invention. An ion source in the device produces an ion beam in a manner which is not shown, said beam being accelerated to an energy of 30 keV directly behind the ion source. The production and acceleration of such an ion beam is generally known per se and need not be elucidated in the context of the present invention. In order to influence the ion beam further the device is also provided with ion optical elements (not shown in the Figure), such as particle lenses for focusing or otherwise diverging or converging the ion beam. The production and acceleration of such an ion beam and the focusing thereof are generally known per se and need not be further elucidated in the context of the present invention.

After having traversed the above-mentioned elements, the ion beam 2 reaches the part of the device shown in FIG. 1. This part consists of a first deceleration stage 4 which is succeeded by a second deceleration stage 6.

The first deceleration stage 4 consists of a first electrode 8, a second electrode 10, a deflection system 12 which consists of two deflection plates 12-1 and 12-2, and a third electrode 14 which also constitutes the final electrode of the first deceleration stage. The second electrode 14 has a tubular shape with a rectangular cross-section. The acceleration of the (positively charged) ions immediately behind the ion source is realized in that the ion source carries a potential of +30 kV relative to the environment. The acceleration electrode used for the acceleration of the ions and the subsequent particle-optical elements then carry ground potential relative to the environment. Consequently, the ions in the beam have a kinetic energy of 30 keV when they reach the electrode 8. The second electrode 10 carries a potential +22 kV, so that the ions are decelerated to a kinetic energy of 8 keV. The deflection system 12 carries a mean potential of +22 kV, the deflection plate 12-1 carrying a potential which is 800 V higher than said mean value whereas the deflection plate 12-2 carries a potential which is 800 V lower than said mean value. Thus, a voltage difference amounting to 1.6 kV exists between these two plates. Finally, the third electrode 14 carries a potential of 22 kV again, so that the ions leave the first deceleration stage with a kinetic energy of 8 keV. The third electrode 14 is provided with a selection gap 16 whose longitudinal direction extends perpendicularly to the plane of drawing. The decelerating electrostatic field between the first electrode 8 on the one side and the electrodes 10, 12 and 14 on the other side focuses the ion beam in the plane of the selection gap 16 and the deflection field between the deflection plates 12-1 and 12-2 moreover, deflects the ion beam to the selection gap 16. The selection gap 16 thus extends perpendicularly to the plane in which the ion beam 2 is deflected by the first deceleration stage.

When the distance between the electrodes 8 and 14 amounts to 87 mm, the length of the electrode 10 amounts to 30 mm and the length and the plate spacing of the deflection system 12 amount to 45 mm and 30 mm, and using the said voltages, the incident ion beam 2 is deflected to an angle of 7° (0.122 rad). It will be evident that in the case of a gap width of 4 mm for the selection gap 16, practically all neutralized ions are intercepted by the electrode 14.

After having traversed through the first deceleration stage 4, the resultant focused and deflected ion beam 2 reaches the second deceleration stage 6. The second deceleration stage 6 consists of a tubular fourth electrode 18 which has a rectangular cross-section, and a fifth electrode 20 which constitutes a final electrode of the second deceleration stage. The fifth electrode 20 is provided with a further selection gap 22.

The fourth electrode 18 carries a potential of 29 kV, so that the ion beam is further decelerated from a kinetic energy of 8 keV to 1 keV between the electrode 16 and the electrode 18, and the fifth electrode 20 carries a potential of 28 kV so that the ions are locally accelerated between the electrode 18 and the electrode 20, but nevertheless in total are subjected to a deceleration from 8 keV to 2 keV. Because of the decelerating electrostatic field in the second deceleration stage 6, the ion beam is subjected to a converging effect in this trap. Because the first crossover of the ion beam is situated ahead of the second deceleration stage, the beam enters the deceleration stage 6 in a diverging fashion. The focusing effect of the deceleration stage 6 ensures that the ion beam is given the desired, small angular spread at the area of the substrate 24.

Because of the presence of the further selection gap 22, neutralized ions are substantially intercepted in the intermediate space between the second electrode 10 and the fourth electrode 20. This is because it may happen that neutralization of ions in the ion beam still takes place In the region in the first deceleration stage where complete or partial deflection of the beam has already taken place. The neutralized ions arriving at that area are situated in the direct vicinity of the intermediate crossover, so that a very large part thereof has a significant transverse component in the velocity, because the beam is strongly diverging in the vicinity of the intermediate crossover. Such neutral particles can now have the first selection gap 16, but are not subjected to the converging effect of the second deceleration stage 6. Subsequent to the second stage 6, the undesirable neutral particles can thus be separated from the ion beam by means of the further selection gap 22. Like the electrode 10, the substrate 24 carries a potential of 28 kV, so that no electric field is present in the state between the final electrode 20 and the substrate 24; consequently, the ions of the ion beam 2 land on the substrate 24 to be doped with an energy of 2 keV.

In order to realize a . . . implantation of ions in the substrate 24, it is necessary to displace the ion beam relative to the substrate. This displacement is performed by . . . the beam in a first direction perpendicular to the plane of drawing, using an electrostatic or magnetic . . . device which is not shown in the Figure. The . . . device is preferably situated upstream from the electrode 8. The desired displacement of the beam relative to the substrate in a second direction perpendicularly to the first direction is performed by displacing the substrate in the vertical direction of FIG. 1, for example from the bottom upwards in the plane of drawing.

Figure 2:
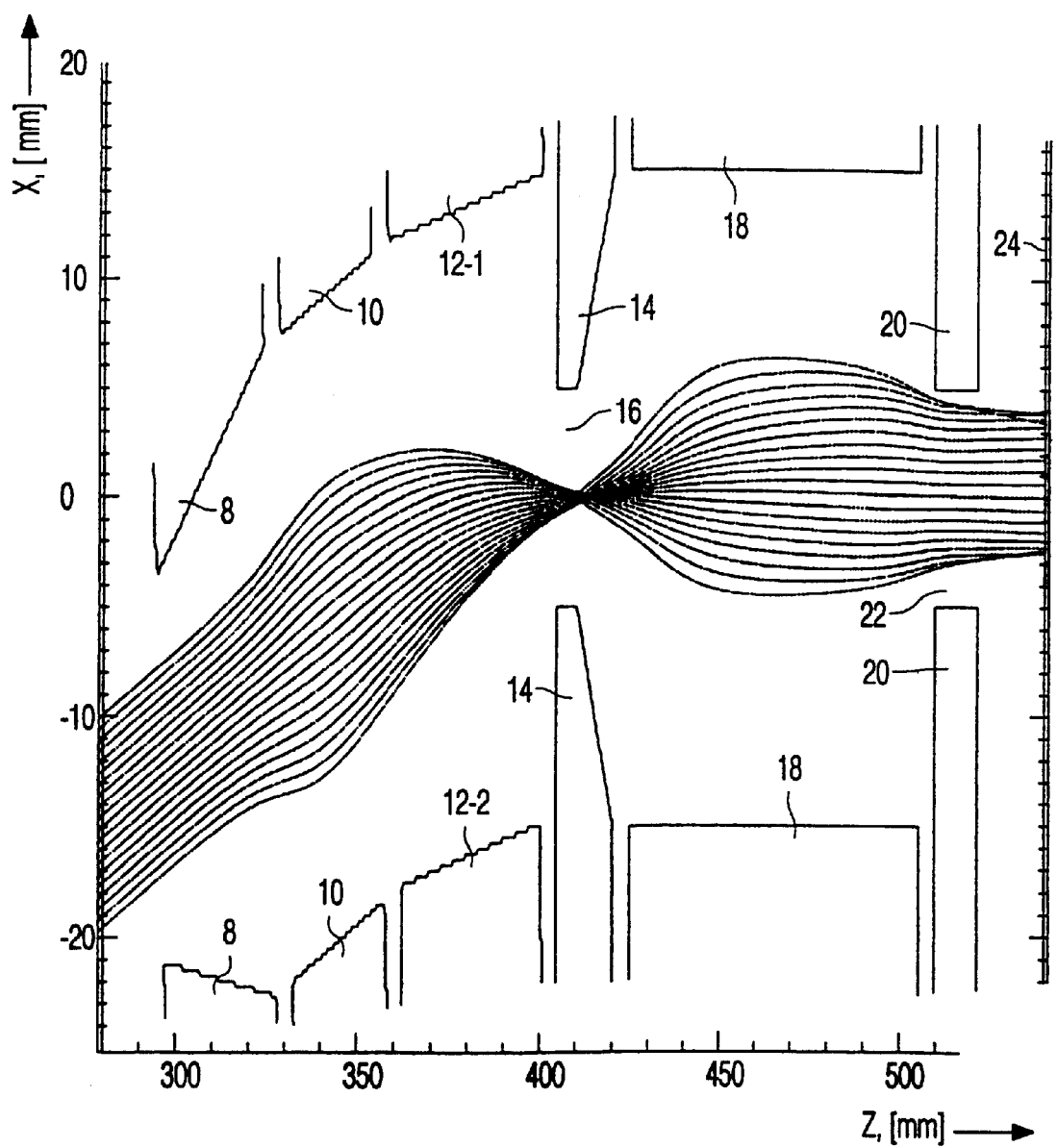
FIG. 2 shows diagrammatically the ion paths in the part of the ion implantation device shown in FIG. 1.

FIG. 2 shows the path of the ion trajectory in the ion beam in the part of the ion implantation device shown in FIG. 1. The ion trajectory shown in this Figure has been obtained in relation by means of a computer program. For this purpose values were assumed which are all the same as those stated in the description of FIG. 1. The various relevant dimensions are given in FIG. 2.

FIG. 2 clearly shows that in the region between the electrodes 8 and 14 the parallel incident beam is focused as well as deflected. If desirable, the gap width 16 could be chosen to be substantially smaller, without impeding the focused beam. Furthermore, this figure clearly shows that the angular spread of the beam which is strongly diverging at the area of the selection gap 16 is significantly reduced by the converging effect of the second deceleration stage 6, so that this beam is incident on the substrate 24 in a substantially parallel fashion.

What is claimed is:

1. An ion implantation device which includes:

an ion source for producing a beam (2) of ions to be implanted in a substrate (24), an acceleration electrode for accelerating the ion beam emanating from the ion source, ion-optical elements which are arranged downstream from the acceleration electrode in order to influence the direction of the ion beam, and a deceleration device which is arranged downstream from said ion-optical elements in order to decelerate and deflect the ion beam, characterized in that the deceleration device includes at least two successive deceleration stages (4, 6), the first one of the two deceleration stages (4), viewed in the downstream direction, being arranged to decelerate the ion beam, deflect the ion beam, and form an intermediate crossover, and the second deceleration stage (6) being arranged to decelerate the ion beam further and to subject this beam to a converging effect.

2. A deceleration device as claimed in claim 1, in which a selection gap (16) is provided between the first (4) and the second deceleration stage (6), the gap direction of said gap extending transversely of the plane in which the beam is deflected by the first deceleration stage.

3. A device as claimed in claim 2, in which the selection gap (16) is provided in a final electrode (14) of the first deceleration stage (4).

4. A device as claimed in claim 1, in which subsequent to the second deceleration stage (6) there is provided a further selection gap (22) whose gap direction extends transversely of the plane in which the beam is deflected by the first deceleration stage (4).

5. A device as claimed in claim 4, in which the further selection gap (22) is provided in a final electrode (20) of the second deceleration stage (6).

6. A method of implanting ions in a substrate (24), which method includes:

producing an ion beam (2);

accelerating the ion beam (2);

influencing the direction of the ion beam (2) after acceleration of the ion beam (2);

decelerating while deflecting the ion beam (2) after the influencing of the direction of the ion beam, characterized in that deceleration takes place in two successive stages, in the first of the two deceleration stages, viewed in the downstream direction, the ion beam is decelerated, the ion beam is deflected, and an intermediate crossover is formed, the ion beam is further delayed and subjected to a converging effect in the second deceleration stage.

7. A method as claimed in claim 6, wherein the ion beam is directed onto a selection gap (16) between the first and the second deceleration stage, the gap direction thereof extending transversely of the plane in which the beam is deflected in the first deceleration stage.

* * * * *